United States Patent [19]

Ishikawa et al.

[11] Patent Number: 4,751,518
[45] Date of Patent: Jun. 14, 1988

[54] HEATING RESISTOR AS A THERMAL HEAD RESISTIVE ELEMENT

[75] Inventors: Takatoshi Ishikawa; Masakazu Kato, both of Furukawa, Japan

[73] Assignee: Alps Electric Co., Ltd., Japan

[21] Appl. No.: 879,271

[22] Filed: Jun. 27, 1986

[30] Foreign Application Priority Data

Jul. 1, 1985 [JP] Japan ................................. 60-144297

[51] Int. Cl.$^4$ ........................ G01D 15/10; H05B 3/00; H01C 1/012; B32B 9/00
[52] U.S. Cl. ............................... 346/76 PH; 219/216; 338/308; 427/402; 427/404
[58] Field of Search ................... 346/76 PH; 219/216; 338/308; 427/402, 404, 58; 430/311

[56] References Cited

U.S. PATENT DOCUMENTS 3,301,707  1/1967  Loeb et al. ...................... 428/270 X
3,763,026 10/1973  Cordes ........................ 204/192.21 X
4,017,712  4/1977  Baraff et al. ........................ 219/216

OTHER PUBLICATIONS

Nunomura, Koyama, Matsubara, "Ta-S:C Thin Film Resistors For Highly Reliable Thermal Printing Heads", IEEE Transactions on Components, Hybrids and Manfacturing Technology, vol. CHMT-6, No. 4, pp. 377-381, Dec. 1983.

Primary Examiner—E. A. Goldberg
Assistant Examiner—Gerald E. Preston
Attorney, Agent, or Firm—Guy W. Shoup

[57] ABSTRACT

Disclosed is a heating resistor composed of tungsten of 35-45 at. %, aluminum of 25-35 at. %, nitrogen of 10-20 at. %, and oxygen of 5-20 at. %, and a thermal head comprising a heating resistor layer composed of tungsten of 35-45 at. %, aluminum of 25-35 at. %, nitrogen of 10-20 at. %, and oxygen of 5-20 at. %.

2 Claims, 1 Drawing Sheet

HEATING RESISTOR AS A THERMAL HEAD RESISTIVE ELEMENT

BACKGROUND OF THE INVENTION

1. Field of the Invention

The present invention relates to a heating resistor which is high in specific resistance and superior in stability in heat-resist property and relates to a thermal head using the same.

2. Description of the Prior Art

Generally, a thermal head is arranged in such a manner that a heating resistor layer for forming dot-like heating resistors, a power supply conductive layer for supplying the heating resistor layer with a current, and a protecting layer for protecting those layers from oxidation and abrasion are laminated one on one on an electrically insulating substrate made of ceramic, or the like, with its surface convered with a thin glass-glazed layer.

Conventionally, a thin film of tantalum nitride ($Ta_2N$) is widely used as the foregoing heating resistor layer. The tantalum nitride thin film is superior in stability and reliability as a heating resistor.

However, since the specific resistance of the tantalum nitride thin film is about 240 $\mu\Omega$-cm, the thickness of the film is required to be made extremely thin so that the lifetime property thereof is too poor to use in the case where high sheet resistivity such as 50 $\Omega/\square$ or more is required. A thermal head using a tantalum nitride thin film as a heat resistor layer has such a characteristic that the resistance value decreases when the surface temperature of the heating portion becomes 400° C. or more, and if the temperature further rises to 500° C. or more, the amount reduction in resistance value reaches 10% or more of the initial value. This is the reduction in resistance value due to progressing of recrystallization of tantalum nitride at a high temperature, resulting in one of serious problems in the case of using tantalum nitride at a high temperature.

SUMMARY OF THE INVENTION

It is therefore an object of the present invention to solve the problem in the prior art.

It is another object of the present invention to provide a heating resistor which is high in specific resistance and superior in stability in heat-resisting property.

It is still another object of the present invention to provide a thermal head using the heat resistor of the kind as described above.

To attain the above-mentioned objects, according to an aspect of the invention, the heating resistor is featured in that it contains tungsten of 35-45 at. %, aluminum of 25-35 at. %, nitrogen of 10-20 at. %, and oxygen of 5-20 at. %.

According to another aspect of the invention, the thermal head is featured in that it comprises a heating resistor layer composed of tungsten of 35-45 at. %, aluminum of 25-35 at. %, nitrogen of 10-20 at. %, and oxygen of 5-20 at. %.

The above and other objects and features of the invention will appear more fully hereinafter from a consideration of the following description taken in connection with the accompanying drawings.

PREFERRED EMBODIMENTS OF THE INVENTION

Figure 1:
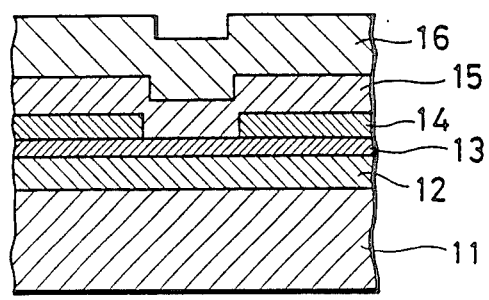
FIG. 1 is a cross-section showing a main portion of an embodiment of the thermal head according to the present invention.

The specific resistance of the heating resistor according to the present invention becomes low when tungsten or aluminum is increased while becomes high when nitrogen or oxygen is increased. Accordingly, a desired specific resistance can be obtained by adjusting the respective contents of tungsten, aluminum, nitride, and oxygen. Although the specific resistance can be made larger desirably, considering a stability in heat-resisting property or reproducibility of a specific resistance, the ratio of composition of tungsten, aluminum, nitride, and oxygen is proper if it is selected to be 35-45 at. %, 25-35 at. %, 10-20 at. %, and 5-20 at. %, respectively, taking the stability in heat-resist property or the reproducibility of specific resistance into consideration. The specific resistance with the foregoing ratio of composition is about 1000-5000 $\mu\Omega$-cm. This value is sufficiently high and substantially the same degree as that is realized by an ordinary resistor having high specific resistance.

Moreover, the heating resistor according to the present invention is remarkably superior in stability in heat-resist property. That is, when the heating resistor with the foregoing ratio of composition according to the present invention was subject to heat treatment in a vacuum of $1.3 \times 10^{-4}$ Pa($1 \times 10^{-6}$ Torr) at 700° C. for 15 minutes and evaluated with respect to its rate of change in resistance value ($\Delta R/R$), the rate of change in resistance value was extremely stable to be $\pm 5\%$ or less. On the other hand, the rate of change in resistance value of tantalum nitride was $-16$ to $-20\%$.

Further, it is also possible to make the rate of change in resistance value zero by properly adjusting the respective contents of tungsten, aluminum, nitride and oxygen within the range of the foregoing ratio of composition.

Thus, according to the invention, the proper ratio of composition of tungsten, aluminum, nitrogen, and oxygen is determined to be 35-45 at. %, 25-35 at. %, 10-20 at. %, and 5-20 at. % respectively. If the ratio of composition of tungsten is selected below 35 at. % or that of aluminum is selected below 25 at. %, the specific resistance becomes 5000 $\mu\Omega$-cm or more and the rate of change in resistance value owing to the heat treatment in a vacuum becomes $+5\%$ or more. If the ratio of composition of tungsten is selected to be 45 at. % or more, or that of aluminum is selected 35 at. % or more, the specific resistance becomes 1000 $\mu\Omega$-cm or less and the rate of change in resistance value becomes $-5\%$ or less. If the ratio of composition of nitride is selected below 10 at. % or that of oxygen is selected below 5 at. %, the specific resistance becomes 1000 $\mu\Omega$-cm or less and the rate of change in resistance value becomes $-5\%$ or less. Further, if the ratio of composition of nitride is selected to be 20 at. % or more, or that of oxygen is selected to be 20 at. % or more, the specific resistance becomes 5000 μΩ-cm or more, and the rate of change in resistance value becomes +5% or more.

The heat resistor according to the present invention can be formed by a spattering method. For example, tungsten chips are placed on the surface of an alumina (Al$_2$O$_3$) target and spattering is performed by using a high frequency magnetron in an atmosphere of mixed gasses of argon and nitrogen.

Though the constitution of the thermal head according to the present invention is not specially limited, for example, the thermal head may employ such an arrangement in which a heating resistor layer made of the foregoing composition, a power supply conductive layer made of a metal thin film of aluminum or the like, and a protecting layer made of silicon oxide, tantalum oxide, or the like, are successively laminated on an insulating substrate made of a ceramic provided with a glass-glazed layer.

EXAMPLE 1

Figure 2:
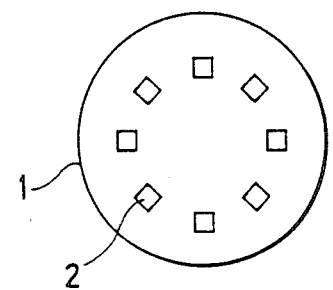
FIG. 2 is a plan view showing a target used for forming a heating resistor layer by spattering according to the present invention.

A thin film of a heat resistor was formed by a spattering method on a glazed alumina substrate. That is, as shown in FIG. 2, tungsten square chips 2 each having 10 mm of each side length and 1-2 mm of thickness were placed on an upper surface of a disk-like alumina (Al$_2$O$_3$) target 1. In this case, it was possible to adjust the content of tungsten in the heat resistor to be formed in a thin film by varying the number of the tungsten tips 2. A thin film heat resistor composed of tungsten, aluminum, oxygen, and nitride could be formed by performing high frequency magnetron spattering by using the complex target in an atmosphere of mixed gasses of argon of partial pressure 0.2–0.9 Pa($1.5 \times 10^{-3} - 7.0 \times 10^{-3}$ Torr) and nitride of partial pressure 0.01–0.05 Pa($7.5 \times 10^{-5} - 4.0 \times 10^{-4}$ Torr) while heating the glazed alumina substrate at 200° C.

EXAMPLE 2

As shown in FIG. 1, a thin glass-glazed layer 12 of about 50 μm thickness was formed on an insulating substrate 14 made of a ceramic, and a heating resistor layer 13 of about 0.13 μm film thickness composed of 37 at. % of tungsten, 31 at. % of aluminum, 16 at. % of nitride, and 11 at. % of oxygen was formed on the thin glass-glazed layer 12 in the same manner as Example 1. Next, a power supply conductive layer 14 constituted by an aluminum thin film of about 1.2 μm thickness was formed. The heating resistor layer 13 and the power supply conductive layer 14 are successively subject to photoetching to form a pattern of a thermal head. Further, an oxidation-preventing protecting film 15 composed of silicon oxide and having a 2 μm thickness, and a wear-resist protecting film 16 composed of tantalum oxide and having a few μm thickness were successivly laminated to thereby produce a thermal head.

Figure 3:
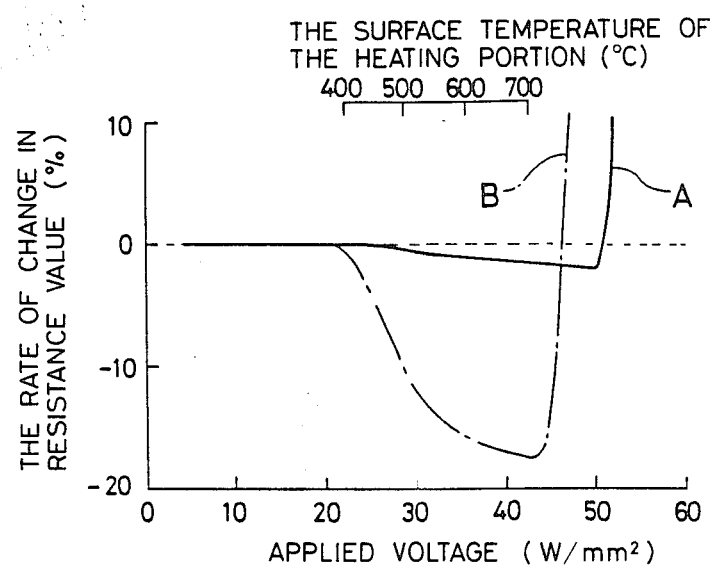
FIG. 3 is a graph showing the result of step stress test (S.S.T.) for the thermal head of the above-mentioned embodiment.

A step stress test (S.S.T) was performed on the thermal head produced in the foregoing manner. The step stress test (S.S.T.) is one of acceleration tests for evaluating stability in heat-resist property of thermal heads and was performed in such a manner that a suitable pulse voltage was applied to a heat resistor for a predetermined period of time to measure the variation in resistance value relative to an initial resistance value while gradually raising the applied voltage until the heating resistor was burnt out, and the rate of change in resistance value in every step was plotted. In this case, the conditions in S.S.T. were set such that the pulse width and period were selected to be 1 m sec. and 20 m sec. respectively and the pulse voltage was applied while increasing step by step by 0.5 volts for 10 minutes in each step, until the rate of change in resistance value exceeded +10%. The result of test is shown in FIG. 3. In FIG. 3, the surface temperature of the heating portion at the respective applied voltages is shown on an axis of abscissa drawn on the above portion in the graph. An infrared-ray spot thermometer was used for measuring temperatures. In the graph, a symbol A designates the characteristics of the thermal head using the heating resistor according to the present invention, B the characteristics of the thermal head using a conventional heating resistor made of tantalum nitride thin film.

As is apparent from FIG. 3, in the conventional thermal head, a resistance value begins to decrease from the point where the applied power is about 22 W/mm$^2$ and the surface temperature of the heating portion is about 400° C., as shown in the curve B. On the other hand, the thermal head using the heating resistor according to the present invention is remarkably superior in stability in heat-resist property, because the rate of change in resistance value is about 2% even even if the applied power exceeds 43 W/mm$^2$ and the surface temperature of the heating portion exceeds 700° C., as seen in the curve A.

As described above, the heating resistor according to the present invention contains tungsten, aluminum, nitrogen, and oxygen with a predetermined composition ratio, so that it is possible to obtain a heating resistor layer which is high in specific resistance and which is superior in stability in heat-resist property.

What is claimed is:

1. A thermal head comprising a thin film resistor layer composed of tungsten of 35–45 atom %, aluminum of 25–35 atom %, nitrogen of 10–20 atom %, and oxygen of 5–20 atom %, and having a stable temperature-resistant characteristic that the rate of change in resistance value of the resistor layer, after being subjected to heat treatment in the range of about 400° C. to 700° C. as compared to its resistance value at room temperature prior to heat treatment, is 5% or less.

2. A heating resistor comprising a thin film resistor layer composed of tungsten of 35–45 atom %, aluminum of 25–35 atom %, nitrogen of 10–20 atom %, and oxygen of 5–20 atom %, and having a stable temperature-resistant characteristic that the rate of change of resistance value of the resistor layer, after being subjected to heat treatment in the range of about 400° C. to 700° C. as comapred to its resistance value at room temperature prior to heat treatment, is 5% or less.

* * * * *